(12) United States Patent
Benzel et al.

(10) Patent No.: US 6,511,913 B1
(45) Date of Patent: Jan. 28, 2003

(54) METHOD FOR MANUFACTURING A MEMBRANE

(75) Inventors: Hubert Benzel, Pliezhausen (DE); Stefan Finkbeiner, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 12 days.

(21) Appl. No.: 09/615,142

(22) Filed: Jul. 13, 2000

(30) Foreign Application Priority Data

Jul. 13, 1999 (DE) .......................................... 199 32 541

(51) Int. Cl.[7] .............................................. H01L 21/62
(52) U.S. Cl. .................... 438/694; 438/705; 438/753
(58) Field of Search .................. 438/694, 705, 438/753

(56) References Cited

U.S. PATENT DOCUMENTS 5,068,203 A * 11/1991 Logsdon et al. .............. 437/89
5,726,066 A * 3/1998 Choi ............................. 437/3

* cited by examiner

Primary Examiner—Robert Kunemund
(74) Attorney, Agent, or Firm—Kenyon & Kenyon

(57) ABSTRACT

A method for manufacturing a membrane in which an n-doped epitaxy layer is applied on a p-doped silicon substrate. Disposed between the silicon substrate and the epitaxy layer is a p-doping which leads to a reduction of the membrane thickness during a subsequent etching process.

10 Claims, 2 Drawing Sheets

METHOD FOR MANUFACTURING A MEMBRANE

FIELD OF THE INVENTION

The present invention concerns a method for manufacturing a membrane.

BACKGROUND INFORMATION

It is believed that there are methods for producing a membrane in which an n-doped epitaxy layer is applied on a p-doped substrate. In a further step, a recess is then etched by starting the etching from the backside of the substrate and stopping at the p-n junction between the substrate layer and epitaxy layer. The recess introduced in this manner defines the geometric dimensions of the membrane.

SUMMARY OF THE INVENTION

The exemplary method of the present invention is believed to have the advantage that the thickness of the membrane can be reduced. In so doing, it is not necessary to reduce the thickness of the epitaxy layer.

Further advantages may result from the following features. The p-doping is introduced into the epitaxy layer particularly simply by the use of a mask and applying a dopant in the substrate. In so doing, the dopant can be introduced both from the vapor phase and by implantation. In addition, the mask allows a patterned application of the p-doping. When it extends over the entire area of the membrane, then the total thickness of the membrane can be reduced. Furthermore, it is also possible to form only partial areas, particularly edge areas, of the membrane so that they are thinner by introducing the p-doping. Individual areas of the membrane can also be formed thicker by introducing an n-doping. In this context, an embodiment may be particularly advantageous in which the mid-region of the membrane is thickened and the edge areas are formed to be thinner, since a stress (or voltage) concentration is thus effected in the edge areas. By the introduction of piezoresistors in the epitaxy layer and of integrated circuits, sensors can be produced which verify stress (or voltage) states in the membrane.

DETAILED DESCRIPTION

Figure 1:
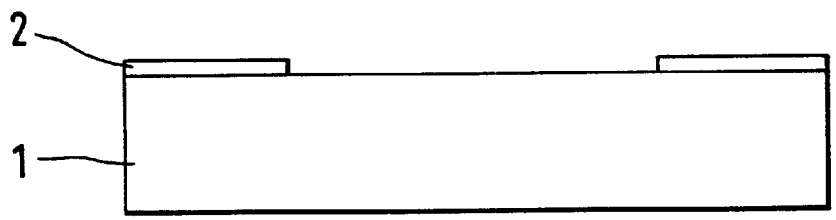
FIG. 1 shows a part of a first exemplary method of the present invention.

FIG. 1 shows a single-crystalline silicon substrate 1 whose top side is covered by a patterned masking layer 2. Single-crystalline silicon substrate 1 is a substrate having a p-doping. Masking layers of semiconductor technology, such as, for example, silicon oxide, silicon nitride or a mixture of these materials may be used for masking layer 2. Masking layer 2 is patterned by applying a photoresist layer, patterning this photoresist layer by an exposure process and etching masking layer 2.

Figure 2:
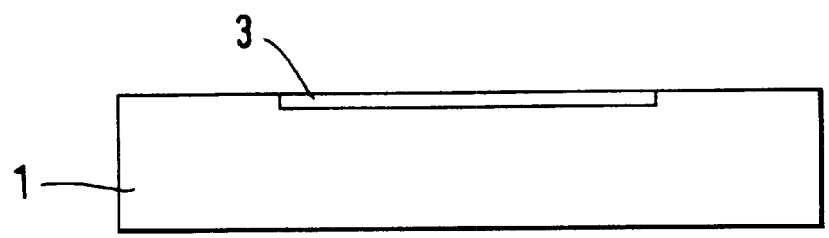
FIG. 2 shows another part of a first exemplary method of the present invention.

In a further process step, dopants 3 are then introduced into the top side of the silicon substrate. In this case, masking 2 covers certain regions of the single-crystalline silicon substrate surface, so that no dopants are introduced in these regions. Dopants 3 thus introduced are shown in FIG. 2 in which masking layer 2, now no longer needed, is removed again. Dopants 3 are in turn a p-doping whose doping concentration, however, is heavier than that of substrate 1. For example, dopant 3 can be introduced into the top side of silicon substrate 1 by implanting the surface with appropriate dopants. A further possibility is a temperature treatment in which dopants for a p-doping are available in great number on the top side of silicon substrate 1, so that a diffusion of dopants into silicon substrate 1 follows.

Figure 3:
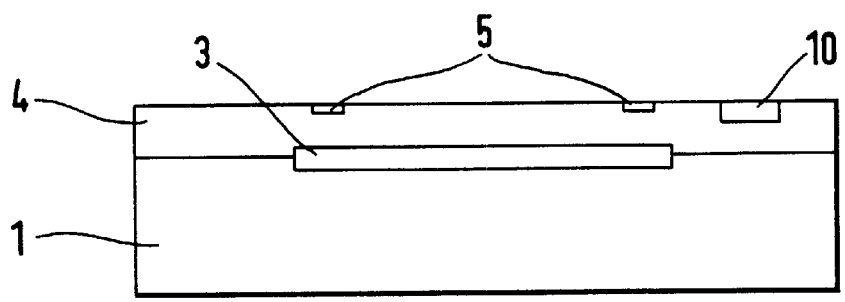
FIG. 3 shows another part of a first exemplary method of the present invention.

In a further step, an n-doped epitaxy layer 4 is now applied. As FIG. 3 shows, in so doing, p-doping 3 is also distributed in epitaxy layer 4 by a diffusion process. Therefore, p-doped region 3 extends partially into silicon substrate 1 and partially into epitaxy layer 4. Thus, p-doping 3 is disposed at the interface between silicon substrate 1 and epitaxy layer 4 and extends into both regions. Therefore, a p-n junction is then formed between n-doped epitaxy layer 4 and p-doping 3 by this extension of p-doping 3 into both regions. This p-n junction is put in by the introduction of additional p-doping 3 into epitaxy layer 4. This is believed to be important for a subsequent etching step.

Still further process steps are carried out which are important for practical utilization of the membrane. For example, piezoresistance elements 5 or circuits 10 are produced in epitaxy layer 4 in additional process steps.

Figure 4:
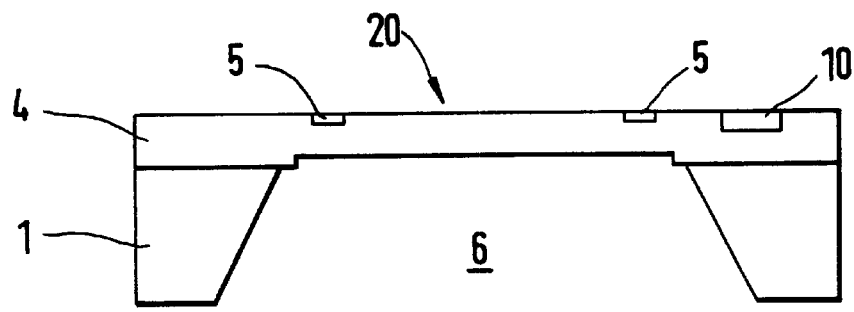
FIG. 4 shows another part of a first exemplary method of the present invention.

In a further step, a recess 6 is etched in starting from the bottom side of silicon substrate 1. This state is shown in FIG. 4. A membrane region, made of n-doped epitaxy layer 4, is now formed by recess 6. In this context, the size of the membrane is defined by the geometric size of recess 6. The thickness of the membrane is formed here by the thickness of n-doped epitaxy layer 4, reduced by the thickness with which p-doping 3 extends into epitaxy layer 4. Thus, when working with a predefined thickness of the epitaxy layer, the membrane region can be reduced by the use of the additional doping 3. The reason for this is that the etching process for recess 6 ends at the interface between the p-doped substrate and the n-doped material of epitaxy layer 4. To etch recess 6, an electrochemical etching process is used in which an etch stop is achieved at the junction between the p-doped silicon and the n-doped silicon by applying appropriate voltages. The reverse voltage applied across the p-n junction is selected in such away that when etching in KOH with a reference electrode, such as, for example, Pt, the potential in the p-type area lies below the etch stop potential (is etched) and lies above the etch stop potential in the n-type area (is not etched).

In this way, when working with a predefined thickness of epitaxy layer 4, the membrane region, as far as the thickness is concerned, can be formed to be thinner than epitaxy layer 4. Since the doping profiles of such a p-doping in an epitaxy layer 4 made of n-doped silicon can be controlled very precisely, the thickness of the membrane can also be precisely controlled. Above all, such a reduction in the membrane thickness. is also of interest when the thickness of epitaxy layer 4 is predefined by other processes, e.g., when a specific thickness of epitaxy layer 4 is implemented for introducing a circuit 10.

Other methods for reducing the thickness of the membrane, such as time-controlled etch removal of epitaxy layer 4 only in membrane region 20, may have the problem that the exact thickness of membrane 20 can only be adjusted with low accuracy using such a method. The fluctuations of such a process are believed to be greater than the fluctuations resulting from forming a suitable p-doping 3 in epitaxy layer 4.

Figure 5:
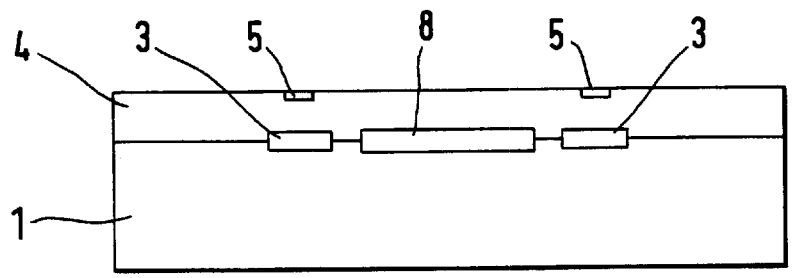
FIG. 5 shows a part of a second exemplary method of the present invention.
Figure 6:
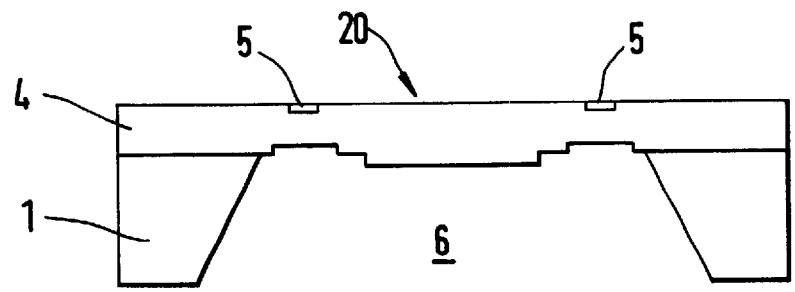
FIG. 6 shows another part of a second exemplary method of the present invention.

FIGS. 5 and 6 show a further exemplary method according to the present invention. The silicon substrate, the epitaxy layer and the piezoresistors are again designated in FIG. 5 by reference numerals 1, 4 and 5. Furthermore, a p-doping 3 is provided which, however, does not extend over the entire membrane region 20 (which is first shown in FIG. 6), but rather is formed only in an edge area. In this context, p-doping 3 surrounds the entire edge area of membrane region 20. On the other hand, a strong n-doping 8 is provided in the center of membrane region 20. This n-doping 8 is introduced using a similar process as was described for introducing doping 3. In a subsequent electrochemical etching, as was already described, membrane 20 is then produced as it is shown in FIG. 6. The thickness of membrane 20 in an edge area (i.e., in the region where p-doping 3 was provided) is less than the original thickness of epitaxy layer 4, while in the mid-region (where the strong n-doping 8 was introduced), membrane region 20 is thicker than the original thickness of epitaxy layer 4. Therefore, a membrane region 20 can be produced in which the thickness of individual areas is selectively increased, while the thickness of other areas is reduced. This is believed to be a particular advantage in the case of membrane regions 20 which are used for pressure sensors, since particularly high mechanical forces can occur in the area of the piezoelements likewise shown in FIG. 6. By using a thickened mid-region in the center of membrane region 20, the linearity of such a sensor should be improved.

Figure 7:
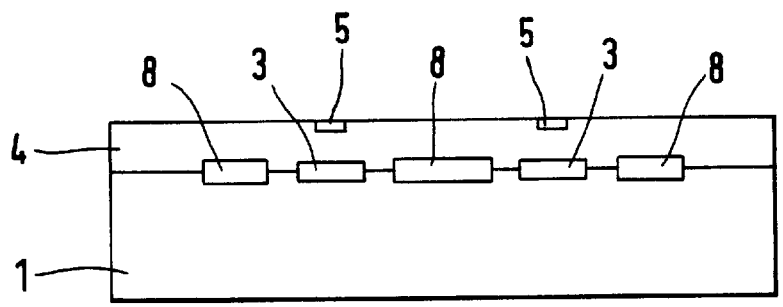
FIG. 7 shows a part of a third exemplary method of the present invention.
Figure 8:
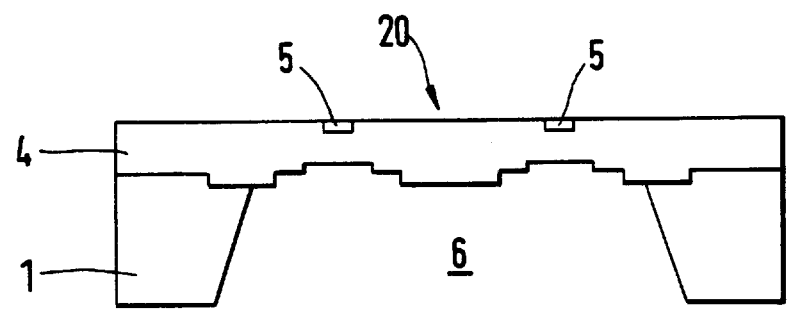
FIG. 8 shows another part of a third exemplary method of the present invention.

FIGS. 7 and 8 show a further exemplary method according to the present invention. The silicon substrate, the epitaxy layer and the piezoresistors are again designated in FIG. 7 by reference numerals 1, 4 and 5. Moreover, as in FIGS. 5 and 6, a p-doping 3 is provided which is formed only in an edge area. In this context, p-doping 3 surrounds the entire edge area of membrane region 20. As in FIGS. 5 and 6, a strong n-doping 8 is provided in the center of membrane region 20. In addition, the entire edge area of membrane 20 is also surrounded by a strong n-doping 8. As FIG. 8 shows, in this manner a membrane region 20 is produced in which the outer edge is thickened, further inward (under piezoelements 5) membrane region 20 is then thinner, and in the mid region, a thickening is again provided. Membrane region 20 of FIG. 8 differs from membrane region 20 as shown in FIG. 6 due to the additional outer thickening of the membrane. Achieved by this measure is the result that, when etching recess 6, variations in the thickness of the silicon substrate should not be of such great consequence. The enlargements of membrane region 20 caused by such variations lie in a thickened region, and thus the mechanical properties of the membrane are not believed to be substantially influenced.

What is claimed is:

1. A method for manufacturing a membrane, the method comprising the steps of:

applying an n-doped epitaxy layer on a front face of a p-doped silicon substrate;

providing a part of the n-doped epitaxy layer with a p-doping at the interface between the n-doped and p-doped epitaxy layers; and etching a recess by starting from a backside of the p-doped silicon substrate in accordance with an etching process that etches p-doped silicon and that does not etch n-doped silicon, a membrane being formed by removing p-doped material in the n-doped epitaxy layer during etching.

2. The method of claim 1, further comprising the steps of applying a mask prior to the step of applying the n-doped epitaxy layer; and introducing a dopant into an area of the p-doped silicon substrate not covered by the mask.

3. The method of claim 1, wherein the p-doping extends entirely over the membrane.

4. The method of claim 1, wherein the p-doping extends only over partial areas of the membrane.

5. The method of claim 4, wherein the p-doping extends over edge areas of the membrane.

6. The method of claim 4, further comprising the step of introducing an n-doping into the p-doped silicon substrate in a region of the membrane.

7. The method of claim 6, wherein the region of the membrane is a mid-region of the membrane.

8. The method of claim 6, wherein the n-doping is introduced over edge areas of the membrane.

9. The method of claim 1, further comprising the step of introducing piezoresistive resistor elements into the n-doped epitaxy layer.

10. The method of claim 1, further comprising the step of introducing integrated circuits into the n-doped epitaxy layer.

* * * * *